US012690424B2

(12) United States Patent
Kim et al.

(10) Patent No.: US 12,690,424 B2
(45) Date of Patent: Jul. 21, 2026

(54) LIFT PIN ASSEMBLY AND SUBSTRATE PROCESSING APPARATUS HAVING SAME

(71) Applicant: SEMES CO., LTD., Cheonan-si (KR)

(72) Inventors: Kuk Saeng Kim, Yongin-si (KR); Jun Hyeak Choi, Seoul (KR); Wan Hee Jeong, Hwaseong-si (KR); Do Youn Lim, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 492 days.

(21) Appl. No.: 17/735,015

(22) Filed: May 2, 2022

(65) Prior Publication Data

US 2023/0207378 A1    Jun. 29, 2023

(30) Foreign Application Priority Data

Dec. 28, 2021    (KR) ........................ 10-2021-0189630

(51) Int. Cl.
| | |
|---|---|
| *H10P 72/76* | (2026.01) |
| *C23C 16/458* | (2006.01) |
| *H01J 37/32* | (2006.01) |
| *H10P 72/00* | (2026.01) |
| *H10P 72/72* | (2026.01) |

(52) U.S. Cl.
CPC .... *H10P 72/7612* (2026.01); *H01J 37/32715* (2013.01); *H10P 72/0606* (2026.01); *H10P 72/7624* (2026.01); *C23C 16/4586* (2013.01); *H01J 37/321* (2013.01); *H01J 37/3244* (2013.01); *H01J 37/32724* (2013.01); *H10P 72/72* (2026.01)

(58) Field of Classification Search
CPC ............. H01L 21/68742; H01J 37/321; H01J 37/32715; H01J 37/3244; H01J 37/32724; H10P 72/7612; H10P 72/0606; H10P 72/7624; H10P 72/72; C23C 16/4586
See application file for complete search history.

(56) References Cited

U.S. PATENT DOCUMENTS 6,254,371 B1 *   7/2001   McNally ............. B29C 45/0441
                                                              425/451.2
11,551,965 B2    1/2023   Nguyen et al.
                          (Continued)

FOREIGN PATENT DOCUMENTS

KR    10-2011-0107274    9/2011
KR    10-2018-0106926    10/2018
                (Continued)

OTHER PUBLICATIONS

Office Action from the Korean Intellectual Property Office dated Nov. 14, 2023.

*Primary Examiner* — Kurt Sweely

(57) ABSTRACT

A substrate support unit includes a substrate support member that supports a substrate, the substrate support member being provided with one or more pin holes vertically penetrating the substrate support member, and a lift pin assembly provided to be lifted along a corresponding pin hole. The lift pin assembly includes lift pins, each lift pin having an upper end contacting the substrate and supporting the substrate, and a pin drive unit that is coupled to the lift pins and lifts the lift pins. The pin drive unit includes piezoelectric motors below the lift pins, respectively.

14 Claims, 6 Drawing Sheets

(56) References Cited

U.S. PATENT DOCUMENTS

| | | | |
|---|---|---|---|
| 2008/0124200 A1* | 5/2008 | Lee | H01L 21/68742 |
| | | | 414/217.1 |
| 2009/0027657 A1* | 1/2009 | Serebryanov | H01L 21/681 |
| | | | 356/73 |
| 2009/0251699 A1* | 10/2009 | George | H10P 72/53 |
| | | | 356/399 |
| 2011/0236162 A1* | 9/2011 | Shikayama | H01L 21/68742 |
| | | | 414/222.01 |
| 2018/0308740 A1* | 10/2018 | Achanta | H01L 21/6831 |
| 2019/0035671 A1* | 1/2019 | Ha | H01L 21/68742 |
| 2019/0043744 A1* | 2/2019 | Cho | H01L 21/68735 |
| 2019/0221403 A1* | 7/2019 | Myung | H01J 37/32458 |
| 2020/0203208 A1* | 6/2020 | Pethe | H01L 21/324 |
| 2021/0028052 A1* | 1/2021 | So | H01L 21/682 |
| 2021/0060726 A1* | 3/2021 | Zuniga | B24B 37/32 |
| 2021/0066114 A1* | 3/2021 | Chen | H01L 21/68735 |

FOREIGN PATENT DOCUMENTS

| | | |
|---|---|---|
| KR | 10-2019-0136717 | 12/2019 |
| KR | 10-2020-0070018 | 6/2020 |

* cited by examiner

900

1

LIFT PIN ASSEMBLY AND SUBSTRATE PROCESSING APPARATUS HAVING SAME

CROSS REFERENCE TO RELATED APPLICATION

The present application claims priority to Korean Patent Application No. 10-2021-0189630, filed Dec. 28, 2021, the entire contents of which is incorporated by reference herein for all purposes.

BACKGROUND OF THE INVENTION

1. Field of the Invention

The present disclosure relates to a lift pin assembly that supports a substrate, and a substrate support unit and a substrate processing apparatus including the same.

2. Description of the Related Art

In general, various processes such as cleaning, deposition, photography, etching, and ion implantation are performed in order to manufacture a semiconductor element.

A substrate support unit that supports a substrate is located in a space in which each process is performed. The substrate support unit sends and receives a substrate to and from a transport robot. In general, the substrate support unit includes a substrate support member and a lift pin assembly. The lift pin assembly may include a lift pin used for sending and receiving a substrate to and from the transport robot, and a lift pin drive member that moves the lift pin up and down. The lift pin is lifted to protrude upward from the substrate support member or is lowered to be inserted into the substrate support member, by the lift pin drive member. The lift pin is moved upward when the substrate is lifted from the substrate support member, and is moved downward when the substrate is placed on the substrate support member.

FIGS. 1 and 2 are views illustrating a lift pin assembly in the related art. FIG. 1 is a perspective view illustrating a typical lift pin assembly 1. FIG. 2 is a partially enlarged view of FIG. 1. The lift pin assembly 1 in the related art includes a plurality of lift pins 5, a pin plate 3 to which the plurality of lift pins 5 are fixed (7) by a screw coupling method or the like, and a pin drive member 2 that lifts the lift pin 5 by lifting and lowering the pin plate 3.

The plurality of lift pins 5 fixed to the pin plate 3 may be collectively lifted by the pin drive member 2 (for example, air cylinder) disposed on one side of the pin plate 3. That is, the heights of the lift pins 5 may be collectively controlled.

Hanging and thermal deformation of the pin plate 3 may occur due to the arrangement in which the pin drive member 2 is biased on one side of the pin plate 3. The hanging may occur larger in a region of the pin plate 3 located at a relatively long distance from the pin drive member 2, than in a region of the pin plate 3 located at a relatively short distance from the pin drive member 2. Thus, a step of correcting variation in height that occurs due to the different heights of the lift pins 5 is required. With the lift pins 5 having different heights, the heights at which the substrate is supported vary, and the substate is bent. This may cause a problem in the process.

In a method of correcting the height of the lift pin 5 in the related art, the process is stopped, and then an operator manually adjusts the height of each lift pin 5 (for example, adjusts the tightening degree of the screw-coupled lift pin). Thus, such a step is cumbersome, and there is a probability that the height control of the lift pin 5 is not precise depending on the skill level of the operator. In addition, because such a step is performed in a state where the process is stopped, there is a problem that the productivity is deteriorated by the step of adjusting the height of the lift pin 5.

SUMMARY OF THE INVENTION

The present disclosure has been made to solve the above-described problems, an object of the present disclosure is to provide a lift pin assembly capable of precisely controlling a height of a lift pin for supporting a substrate and a substrate processing apparatus including the lift pin assembly.

Another object of the present disclosure is to provide a lift pin assembly capable of independently controlling the height of each lift pin, and a substrate processing apparatus including the lift pin assembly.

Still another object of the present disclosure is to provide a lift pin assembly capable of controlling the height of the lift pin without a manual operation of an operator, and a substrate processing apparatus including the lift pin assembly.

Objects of the present disclosure are not limited to those described above, and other objects and advantages not mentioned will be understood from the following description.

According to an embodiment of the present disclosure, a lift pin assembly includes a plurality of lift pins, each lift pin having an upper end contacting a substrate and supporting the substrate, and a pin drive unit that is coupled to the plurality of lift pins and lifts the plurality of lift pins. The pin drive unit includes a plurality of piezoelectric motors below the plurality of lift pins, respectively.

According to an embodiment of the present disclosure, a substrate support unit includes a substrate support member that supports a substrate, the substrate support member being provided with one or more pin holes vertically penetrating the substrate support member, and a lift pin assembly provided to be lifted along a corresponding pin hole. The lift pin assembly includes a plurality of lift pins, each lift pin having an upper end contacting the substrate and supporting the substrate, and a pin drive unit that is coupled to the plurality of lift pins and lifts the plurality of lift pins. The pin drive unit includes a plurality of piezoelectric motors below the plurality of lift pins, respectively.

According to an embodiment of the present disclosure, a substrate processing apparatus includes a housing having a processing space therein, a substrate support unit that supports a substrate in the processing space, and a fluid supply unit that supplies a processing fluid into the processing space. The substrate support unit includes a substrate support member on which the substrate is placed, the substrate support member being provided with one or more pin holes vertically penetrating the substrate support member, and a lift pin assembly provided to be lifted along a corresponding pin hole. The lift pin assembly includes a plurality of lift pins inserted into the corresponding pin hole to be lifted to a lifted position, and a pin drive unit including a plurality of piezoelectric motors coupled to the plurality of lift pins, respectively.

According to an embodiment of the present disclosure, a method of adjusting a height variation among a plurality of lift pins that are connected to a plurality of piezoelectric motors, respectively, includes lifting the plurality of lift pins to a lifted position, detecting a height of each lift pin at the lifted position, and correcting a height variation among the plurality of lift pins at the lifted position by adjusting a voltage supplied to each piezoelectric motor based on the detected height of each lift pin.

According to the embodiments, it is possible to precisely control the height of the lift pin by controlling the height of the lift pin by the piezoelectric motor to which a piezoelectric element is applied.

In addition, because the piezoelectric motor is applied to each of the plurality of lift pins, it is possible to independently control the height of each lift pin.

Furthermore, because the controller that controls the height of each lift pin in accordance with the height automatically corrects the height variation between the lift pins, it is possible to reduce a process time and improve productivity.

Effects of the present disclosure are not limited thereto, and it should be understood to include all effects that can be inferred from the configuration of the invention described in the detailed description or claims of the present disclosure.

BRIEF DESCRIPTION OF THE DRAWINGS

The above and other objectives, features, and other advantages of the present disclosure will be more clearly understood from the following detailed description taken in conjunction with the accompanying drawings, in which.

DESCRIPTION OF EMBODIMENTS

The terminology used herein and the accompanying drawings are for the purpose of easily describing the present disclosure, and the present disclosure is not limited to the terminology and the drawings. Detailed descriptions of known techniques that are not closely related to the spirit of the present invention among the techniques used in the present disclosure will be omitted. Embodiments described in this specification are for clearly explaining the present invention to those skilled in the art, so the present invention is not limited to the embodiments described herein, and it should be construed that the scope of the present invention includes modifications or changes without departing from the spirit of the present invention.

In an embodiment of the present disclosure, a substrate processing apparatus that etches a substrate by using plasma and includes an inductive coupled plasma (ICP) source will be described as an example. The present disclosure is not limited thereto and can be applied to various apparatuses that include lift pins and perform processes on a substrate, such as a substrate processing apparatus including a capacitive coupled plasma (CCP) source.

In the embodiment of the present disclosure, an example of using an electrostatic chuck as a substrate support unit will be described, but the present disclosure is not limited thereto. In a case where the electrostatic chuck is not necessarily required, the substrate support unit may support a substrate by mechanical clamping or support the substrate by vacuum.

Figure 1:
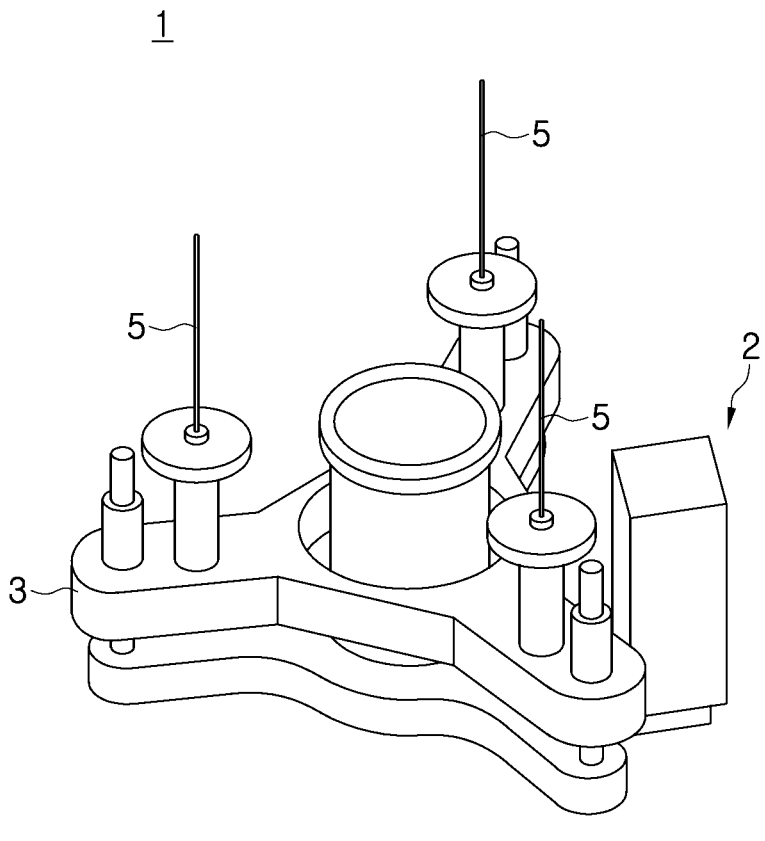
FIG. 1 is a perspective view schematically illustrating a lift pin assembly in the related art.
Figure 2:
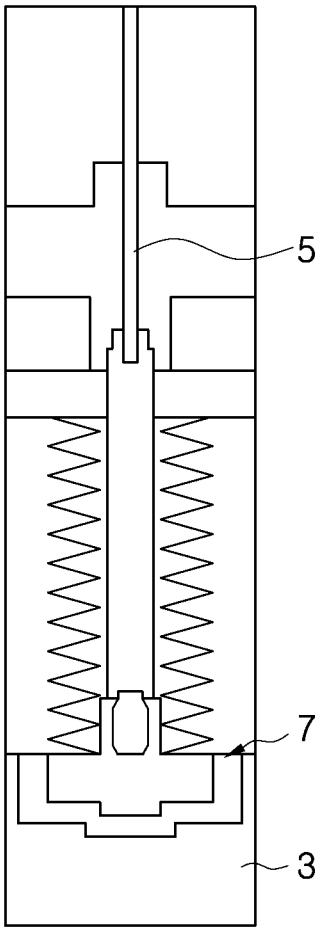
FIG. 2 is a partially enlarged view obtained by enlarging a portion of FIG. 1.
Figure 3:
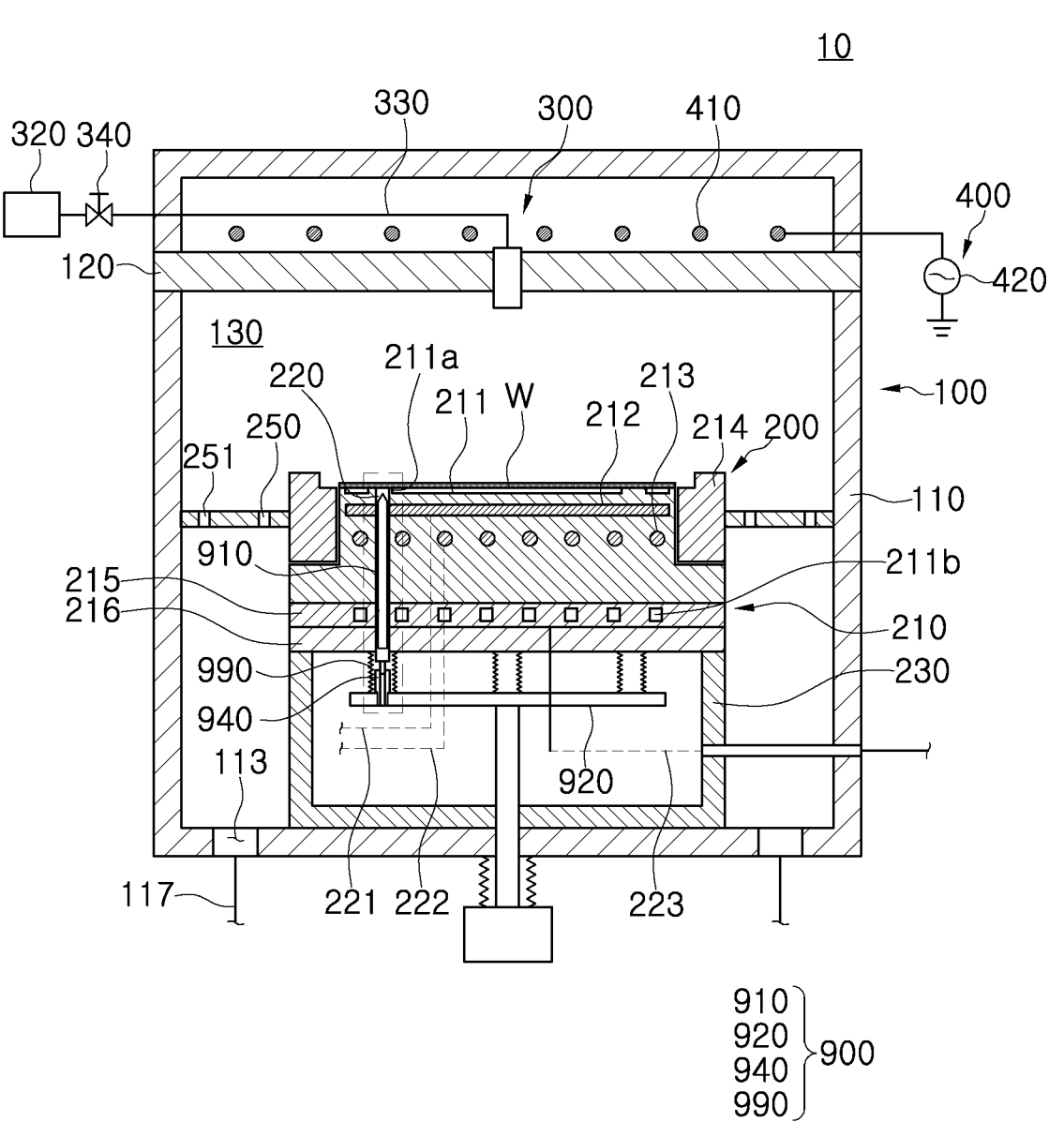
FIG. 3 is a cross-sectional view illustrating a substrate processing apparatus according to an embodiment of the present disclosure.

FIG. 3 is a cross-sectional view illustrating a substrate processing apparatus according to the embodiment of the present disclosure.

With reference to FIG. 3, a substrate processing apparatus 10 processes a substrate W by using plasma. For example, the substrate processing apparatus 10 may perform an etching process on a substrate W. The substrate processing apparatus 10 may include a chamber 100, a substrate support unit 200, a gas (processing fluid) supply unit 300, and a plasma source unit 400.

The chamber 100 provides a space in which plasma processing is performed. The substrate support unit 200 supports the substrate W in the chamber 100. The gas supply unit 300 supplies a process gas into the chamber 100. The plasma source unit 400 generates plasma from the process gas by providing electromagnetic waves in the chamber 100. The components will be described below in detail.

The chamber 100 includes a chamber body 110 and a cover 120. The upper surface of the chamber body 110 is open, and a space is formed in the chamber body 110. An exhaust hole 113 is formed in a bottom wall of the chamber body 110. The exhaust hole 113 is connected to an exhaust line 117 to provides a passage through which the gas staying in the chamber body 110 and reaction byproducts generated in the processes are discharged to the outside. A plurality of exhaust holes 113 may be formed in an edge region of the bottom wall of the chamber body 110.

The cover 120 seals the open upper surface of the chamber body 110. The cover 120 has a radius corresponding to the circumference of the chamber body 110. The cover 120 may be made of a dielectric material. The cover 120 may be made of an aluminum material. A space surrounded by the cover 120 and the chamber body 110 is provided as a processing space 130 in which a plasma processing process is performed.

A baffle 250 controls a flow of the process gas in the chamber 100. The baffle 250 is provided in a ring shape and is located between the chamber 100 and the substrate support unit 200. Distribution holes 251 are formed in the baffle 250. The process gas staying in the chamber 100 passes through the distribution holes 251 and then is introduced into the exhaust hole 113. The flow of the process gas introduced into the exhaust hole 113 may be controlled in accordance with the shape and the arrangement of the distribution holes 251.

The gas supply unit 300 supplies the process gas as a processing fluid into the chamber 100, The gas supply unit 300 includes a nozzle 310, a gas storage portion 320, and a gas supply line 330.

The nozzle 310 is provided in the cover 120. The nozzle 310 may be located in the center region of the cover 120. The nozzle 310 is connected to the gas storage portion 320 through the gas supply line 330. A valve 340 is installed on the gas supply line 330. The valve 340 opens and closes the gas supply line 330 to adjust the supply flow rate of the process gas. The process gas stored in the gas storage portion 320 is supplied to the nozzle 310 through the gas supply line 330, and sprayed from the nozzle 310 into the chamber 100. The nozzle 310 mainly supplies the process gas to the center region of the processing space 130. The gas supply unit 300 may further include a nozzle (not illustrated) provided in the side wall of the chamber body 110. Such a nozzle supplies the process gas to the edge region of the processing space 130.

The plasma source unit 400 generates plasma from the process gas. The plasma source unit 400 includes an antenna 410, a power source 420, and an upper cover 430.

The antenna 410 is provided above the chamber 100. A spiral coil may be provided as the antenna 410. The power source 420 is connected to the antenna 410 through a cable and applies radio frequency power to the antenna 410. An electromagnetic wave is generated from the antenna 410 by applying a radio frequency power. The electromagnetic wave forms an induced electric field in the chamber 100. Plasma is generated from the process gas by obtaining the energy required for ionization from the induced electric field. The plasma is provided for a substrate W, and an etching process may be performed.

The substrate support unit 200 is located in the processing space 130 and supports a substrate W. The substrate support unit 200 may fix the substrate W by using an electrostatic force or support the substrate W using a mechanical clamping method. An electrostatic chuck for fixing a substrate W by using an electrostatic force will be described below as an example of the substrate support unit 200.

An electrostatic chuck 200 includes a substrate support member 210, a housing 230, and a lift pin 910.

The substrate support member 210 may attract a substrate by using an electrostatic force. The substrate support member 210 may include a dielectric plate 211, an electrode 212, a heater 213, a focus ring 214, an insulating plate 215, and a ground plate 216.

The dielectric plate 211 is provided in a disc shape. The upper surface of the dielectric plate 211 may have a radius that corresponds to the substrate W or is smaller than the radius of the substrate W. Protrusions 211a may be formed on the upper surface of the dielectric plate 211. The substrate W is placed on the protrusions 211a and is spaced from the upper surface of the dielectric plate 211 at a predetermined distance. In the dielectric plate 211, the side surface is stepped so that a lower region has a radius greater than a radius of an upper region. As an example, the dielectric plate 211 may be made of $Al_2O_3$.

The electrode 212 is buried in the dielectric plate 211. The electrode 212 is a thin disc made of a conductive material. The electrode 212 is connected to an external power source (not illustrated) through a cable 221. Power applied from the external power source generates an electrostatic force between the electrode 212 and the substrate W to fix the substrate W to the upper surface of the dielectric plate 211. The external source may be a DC power source.

The heater 213 is provided in the dielectric plate 211. The heater 213 may be provided below the electrode 212. The heater 213 is connected to an external power source (not illustrated) through a cable 222. The heater 213 generates heat with a current applied from the external power source. The generated heat is transferred to the substrate W through the dielectric plate 211 to heat the substrate W to a predetermined temperature. A spiral coil may be provided as the heater 213, and the heater 213 may be buried in the dielectric plate 211 at uniform intervals.

The focus ring 214 is provided in a ring shape and is disposed along the circumference of the upper region of the dielectric plate 211. The upper surface of the focus ring 214 may be stepped such that an inner portion adjacent to the dielectric plate 211 is lower than an outer portion thereof. The inner portion of the upper surface of the focus ring 214 may be located at the same height as the upper surface of the dielectric plate 211. The focus ring 214 expands an electromagnetic field forming region so that the substrate W is located at the center of a region in which plasma is formed.

Thus, it is possible to uniformly form the plasma over the entire region of the substrate W.

The insulating plate 215 is located below the dielectric plate 211 and supports the dielectric plate 211. The insulating plate 215 is a disk having a predetermined thickness and has a radius corresponding to the dielectric plate 211. The insulating plate 215 is made of an insulating material. The insulating plate 215 is connected to an external power source (not illustrated) through a cable 223. A radio frequency current applied to the insulating plate 215 through the cable 223 forms an electromagnetic field between the electrostatic chuck 200 and the cover 120. The electromagnetic field provides the energy for generating the plasma.

A cooling path 211b may be formed in the insulating plate 215. The cooling path 211b is located below the heater 213. The cooling path 211b provides a passage for circulating a cooling fluid. The heat of the cooling fluid is transferred to the dielectric plate 211 and the substrate W to rapidly cool the heated dielectric plate 211 and substrate W. The cooling path 211b may be formed in a spiral shape. For the cooling path 211b, ring-shape flow paths having different radii are arranged to have the same center. The flow paths may communicate with each other. The cooling path 211b may be formed in the ground plate 216.

The ground plate 216 is located below the insulating plate 215. The ground plate 216 is a disk having a predetermined thickness and may have a radius corresponding to the insulating plate 215. The ground plate 216 is grounded. The ground plate 216 electrically insulates the insulating plate 215 from the chamber body 110.

A pin hole 220 is formed in the substrate support member 210. The pin hole 220 is formed in the upper surface of the substrate support member 210. The pin hole 220 may vertically penetrate the substrate support member 210. The pin hole 220 is provided from the upper surface of the dielectric plate 211 to the lower surface of the ground plate 216 through the dielectric plate 211, the insulating plate 215, and the ground plate 216 in this order.

A plurality of pin holes 220 may be formed. A plurality of pin holes 220 may be arranged in a circumferential direction of the dielectric plate 211. For example, three pin holes 220 may be arranged to be spaced from each other at intervals of 120 degrees in the circumferential direction of the dielectric plate 211. Various numbers of pin holes 220 may be formed, for example, four pin holes 220 may be arranged to be spaced from each other at intervals of 90 degrees in the circumferential direction of the dielectric plate 211.

The pin hole 220 may be formed in the protrusion 211a of the dielectric plate 211. For example, a circular pin hole 220 may be formed at the center of the protrusion 211a having a circular planar shape. The protrusion 211a and the pin hole 220 may have various planar shapes. The pin holes 220 may be formed in some protrusions 211a. For example, six protrusions 211a may be arranged to be spaced from each other at intervals of 60 degrees in the circumferential direction of the dielectric plate 211, and three pin holes 220 may be arranged to be spaced from each other at intervals of 30 degrees.

The housing 230 is located below the ground plate 216 and supports the ground plate 216. The housing 230 is a cylinder having a predetermined height, and a space is formed in the housing 230. The housing 230 may have a radius corresponding to the ground plate 216. Various cables (not illustrated) and a lift pin assembly 900 are located in the housing 230.

The lift pin assembly 900 loads a substrate W on the dielectric plate 211 or unloads a substrate W from the dielectric plate 211, with upward and downward movements.

Figure 4:
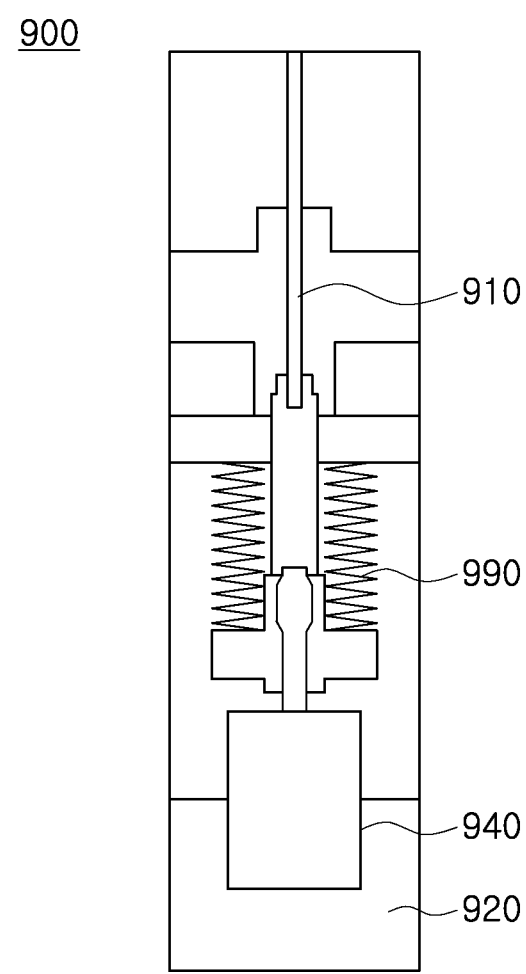
FIG. 4 is a schematic enlarged view for explaining a lift pin assembly in FIG. 3.

With reference to FIG. 4, the lift pin assembly 900 includes the lift pin 910, a pin plate 920, and a pin drive unit 940.

A plurality of lift pins 910 are provided corresponding to the number of pin holes 220, and are accommodated in the respective pin holes 220. Here, the diameter of the lift pin 910 is formed to be finely smaller than the diameter of the pin hole 220. Specifically, the diameter of the lift pin 910 may be the minimum diameter at which the lift pin 910 does not come into contact with the inner wall of the pin hole 220 when the lift pin 910 and the pin hole 220 are arranged to have the same center axis.

The lift pins 910 move up and down along the pin holes 220, and thus the substrate W is loaded/unloaded. As an example, the lift pins 910 are lifted to support a substrate that is transported into the processing space by a robot arm of the transport robot (not illustrated) and then conveyed to the upper portion of the substrate support member 210. Then, the lift pins 910 are lowered to load the substrate on the substrate support member 210. As another example, the lift pins 910 are lifted with supporting a substrate on the substrate support member 210. The substrate is unloaded by transporting the substrate to the robot arm. Then, the lift pins 910 are lowered.

The pin plate 920 is located in the housing 230 and supports the lift pins 910. The pin plate 920 may be connected to the lift pins 910 by the pin drive unit 940 described later. Although not illustrated in detail, a separate drive member (for example, a hydraulic or pneumatic cylinder) for simultaneously adjusting the heights of the lift pins 910 by driving the pin plate 920 in the vertical direction may be provided. The pin plate 920 may be omitted if necessary.

The pin drive unit 940 includes or is formed of a plurality of piezoelectric motors. For the simplicity of drawings, the plurality of piezoelectric motors may be referred to using the same reference 940 as the pin drive unit. The piezoelectric motors 940 may be provided in the same number as the number of lift pins 910 and may be provided below the respective lift pins 910. The lift pin 910 and the pin plate 920 may be coupled to each other by connecting the upper end of the piezoelectric motor 940 to the lower portion of the lift pin 910 and connecting the lower end of the piezoelectric motor 940 to the pin plate 920.

Figure 5:
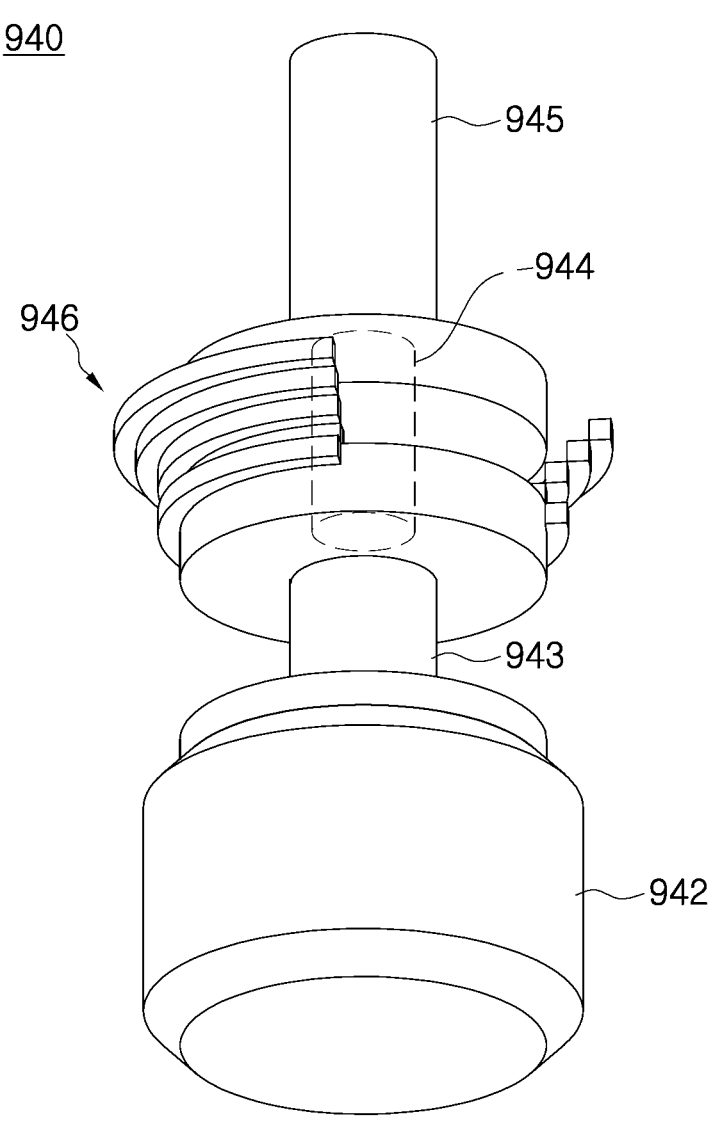
FIG. 5 is a schematic enlarged view for explaining a piezoelectric motor in FIG. 4.

FIG. 5 is a view obtained by enlarging the piezoelectric motor in FIG. 4. With reference to FIG. 5, the piezoelectric motor 940 includes an electric motor 942 and a piezoelectric actuator 944.

The piezoelectric motors 940 provided in the same number as the number of lift pins 910 may be connected in one-to-one correspondence. Each piezoelectric motor 940 may be independently controlled. Thus, upward and downward movements of the lift pin 910 may be independently controlled.

The electric motor 942 is provided below the piezoelectric motor 940 and may be a typical motor that obtains a rotational force from electrical energy. The electric motor 942 may be mounted and fixed to the pin plate 920. The electric motor 942 may lift and lower the lift pin 910.

The piezoelectric actuator 944 is a piezoelectric element using an inverse piezoelectric effect in which mechanical defamation occurs from electrical energy. The piezoelectric actuator 944 may be configured to expand and contract in a vertical direction by a supply of power. The piezoelectric actuator 944 may be connected to the upper portion of the electric motor 942 by a first connection shaft 943 and may be connected to the lower portion of the lift pin 910 by a second connection shaft 945. The height of the lift pin 910 may be adjusted by expansion and contraction of the piezoelectric actuator 944. The degree of expansion and contraction of the piezoelectric actuator 944 can be precisely controlled in accordance with the voltage applied to the piezoelectric actuator 944. Thus, it is possible to finely adjust the height of the lift pin 910 by the piezoelectric actuator 944. The piezoelectric actuator 944 may be connected to the first connection shaft 943 and the second connection shaft 945 by a connection member such as a nut. The connection member and the piezoelectric actuator 944 may be provided in a form surrounded by a joining member 946.

The joining member 946 is provided to protect the piezoelectric actuator 944 and may be provided to expand and contract together with the piezoelectric actuator 944.

Figure 6:
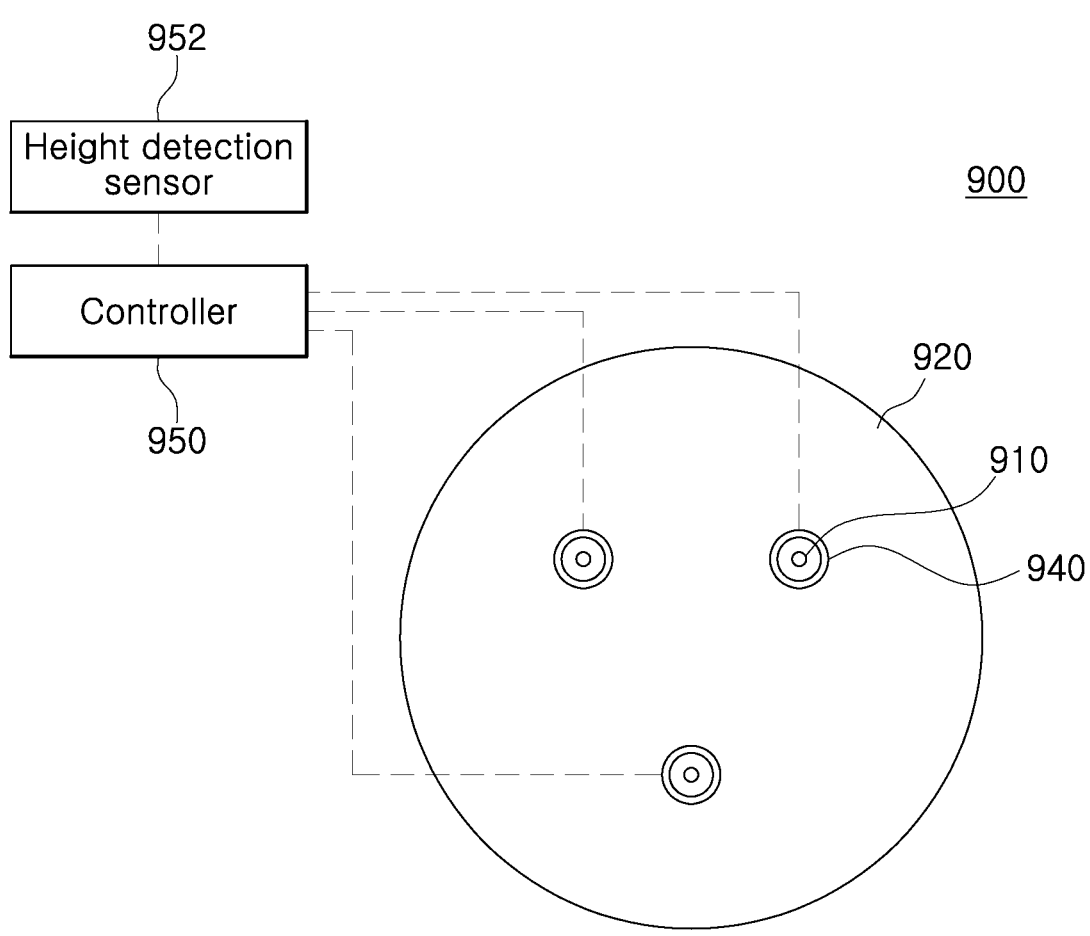
FIG. 6 is a plan view of FIG. 5.

FIG. 6 is a plan view of the lift pin assembly 900 in FIG. 5.

With reference to FIG. 6, the lift pin assembly 900 may further include a controller 950 that controls the pin drive unit 940 and a height detection sensor 952 that detects the height of each lift pin 910.

The height detection sensor 952 may be connected to the controller 950. The height detection sensor 952 can detect the height of each lift pin 910 when each lift pin 910 is lifted by the electric motor 942. When a variation in height is detected in the maximum lifting height of each lift pin 910, the height detection sensor 952 may generate a signal and transmit the signal to the controller 950. For example, the height detection sensor 952 may include an integrated position measuring device (for example, linear encoder) provided for each piezoelectric motor 940.

The controller 950 corrects the heights of the lift pins 910 by controlling the piezoelectric motors 940 based on the signal generated by the height detection sensor 952 so that the heights of the lift pins 910 are equal to each other. The controller 950 may be individually connected to the piezoelectric motors 940 and independently control the piezoelectric motors 940. The controller 950 may control the voltage applied to each piezoelectric actuator 944 provided in each piezoelectric motor 940 based on the signal transmitted from the height detection sensor 952.

Although not illustrated in detail, the substrate processing apparatus according to the embodiment of the present disclosure may further include a substrate level sensor that detects the height and the inclination of a substrate transported into the processing space. Height and inclination data of the substrate obtained by the substrate level sensor may be transmitted to the controller 950. Thus, the controller 950 may be configured to perform height control in consideration of the height and inclination data (including the degree of bending of the substrate) of the substrate supported by the lift pins 910 in controlling the heights of the lift pins 910.

A bellows 990 may be provided between the ground plate 216 and the pin plate 920. The upper end portion of the bellows 990 may be connected to the ground plate 216 and the lower end portion thereof may be connected to the pin plate 920. The bellows 990 may be provided to surround some of the lift pins 910 located in the housing 230. The bellows 990 may contract and expand in the up-down direction by lifting of the pin plate 920.

A method of adjusting the height of the lift pin, which is performed by the substrate processing apparatus described above, includes a step of lifting the lift pin 910, a step of detecting the heights of the lifted lift pins 910, and a step of controlling the piezoelectric motors 940 that drive the respective lift pins 910, based on the detected heights of the lift pins 910.

The step of lifting the lift pin 910 may be performed by the electric motor 942 of the piezoelectric motor 940. The electric motor 942 can lift the lift pin 910 by rotating at a preset number of revolutions.

The heights of the lifted lift pins 910 may be detected by the height detection sensor 952, and the signal or data obtained by detection of the height detection sensor 952 may be transmitted to the controller 950. For example, the height detection sensor 952 may detect the height at which each lift pin is raised based on the home position. In this case, the home position may mean a position in which the lift pins are completely lowered while not being used.

The controller 950 may independently control the piezoelectric motors 940 based on the heights of the lift pins 910 detected by the height detection sensor 952 so that the heights of the lift pins 910 are equal to each other. For example, the controller may control each piezoelectric motor to match a preset height previously input to the height controller of the lift pins. In an embodiment, the controller may control each piezoelectric motor to match the height of the lift pins to the average height of the sensed lift pins. The controller 950 may correct the height variation between the lift pins 910 by separately adjusting the voltage supplied to each piezoelectric motor.

After the heights of the lift pins 910 are made to be equal to each other, the lift pins 910 may receive the substrate from the transport robot.

A step of detecting the height and the inclination (degree of bending of the substrate) of the substrate transported into the processing space and a step of controlling the lift pin based on the detected height and inclination may be further performed.

Hitherto, according to the lift pin assembly 900 and the substrate processing apparatus including the lift pin assembly 900 described above, the piezoelectric motor to which the piezoelectric actuator (piezoelectric element) is applied is provided as the pin drive unit that drives the lift pins 910, and the lift pins 910 and the piezoelectric motors are connected to each other in one-to-one correspondence. Thus, effects that it is possible to precisely control the height of the lift pin 910 and to independently control the height of each lift pin 910 are obtained. In addition, since the height of each lift pin 910 is automatically corrected by the controller 950 connected to the height detection sensor, it is possible to omit process interruption and a manual operation of the operator, and thus to reduce the process time and improve the productivity.

Although the above description of the present disclosure has been provided for illustrative purposes, those skilled in the art will appreciate that various modifications, additions, and substitutions are possible, without departing from essential characteristics of the disclosure. Therefore, embodiments of the present disclosure are not intended to limit the technical spirit of the disclosure but rather to describe the technical spirit of the disclosure, and the scope of the disclosure is not to be limited by the above embodiments. The scope of the present invention should be construed by the following claims, and all technical ideas within the scope equivalent thereto should be construed as being included in the scope of the present invention.

What is claimed is:

1. A lift pin assembly comprising:
a plurality of lift pins, each lift pin of the plurality of lift pins having an upper end contacting a substrate and supporting the substrate;
a pin drive unit that is coupled to the plurality of lift pins and is configured to lift the plurality of lift pins to a lifted position,
wherein the pin drive unit includes a plurality of piezoelectric motors below the plurality of lift pins, respectively, and
wherein each piezoelectric motor of the plurality of piezoelectric motors includes an electric motor configured to lift a corresponding lift pin of the plurality of lift pins to a first position and a piezoelectric actuator configured to adjust a height of the corresponding lift pin positioned at the first position by the electric motor;
a height detection sensor configured to detect a height of each lift pin of the plurality of lift pins in the lifted position,
wherein each piezoelectric motor of the plurality of piezoelectric motors further includes:
a first connection shaft connecting the piezoelectric actuator and the electric motor with each other; and
a second connection shaft connecting the piezoelectric actuator to the corresponding lift pin of the plurality of lift pins; and
a controller configured to:
control the electric motor to lift the corresponding lift pin to the first position;
receive height information of each of the plurality of lift pins from the height detection sensor after the plurality of lift pins are lifted to the first position; and
control the piezoelectric actuator by adjusting an applied voltage to the corresponding lift pin based on the received height information, thereby compensating for height differences among the plurality of lift pins lifted to the first position.

2. The lift pin assembly according to claim 1,
wherein the piezoelectric actuator is configured to expand or contract in a vertical direction in response to a supply of power.

3. The lift pin assembly according to claim 2,
wherein the height of each of the plurality of lift pins is adjusted by adjusting a voltage supplied to the piezoelectric actuator in each of the plurality of piezoelectric motors.

4. The lift pin assembly according to claim 1,
wherein the controller independently controls the piezoelectric actuator of each piezoelectric motor of the plurality of piezoelectric motors so that the plurality of lift pins have the same height in the lifted position.

5. A substrate support unit comprising:
a substrate support member that supports a substrate, wherein the substrate support member is provided with one or more pin holes vertically penetrating the substrate support member; and
a lift pin assembly configured to be lifted along a corresponding pin hole among the one or more pin holes, wherein the lift pin assembly includes:
a plurality of lift pins, each lift pin of the plurality of lift pins having an upper end contacting the substrate and supporting the substrate,
a pin drive unit that is coupled to the plurality of lift pins and is configured to lift the plurality of lift pins to a lifted position, wherein the pin drive unit includes a plurality of piezo-electric motors below the plurality of lift pins, respectively, and wherein each piezoelectric motor of the plurality of piezoelectric motors includes an electric motor configured to lift a corresponding lift pin of the plurality of lift pins to a first position and a piezoelectric actuator configured to adjust a height of the corresponding lift pin positioned at the first position by the electric motor, a height detection sensor configured to detect a height of each lift pin of the plurality of lift pins in the lifted position, wherein each piezoelectric motor of the plurality of piezoelectric motors further includes:

a first connection shaft connecting the piezoelectric actuator and the electric motor with each other; and a second connection shaft connecting the piezoelectric actuator to the corresponding lift pin of the plurality of lift pins, and a controller configured to:

control the electric motor to lift the corresponding lift pin to the first position;

receive height information of each of the plurality of lift pins from the height detection sensor after the plurality of lift pins are lifted to the first position; and control the piezoelectric actuator by adjusting an applied voltage to the corresponding lift pin based on the received height information, thereby compensating for height differences among the plurality of lift pins lifted to the first position.

6. The substrate support unit according to claim 5, wherein the piezoelectric actuator is configured to expand or contract in a vertical direction in response to a supply of power.

7. The substrate support unit according to claim 6, wherein a height of each of the plurality of lift pins is adjusted by adjusting power supplied to the piezoelectric actuator in each of the plurality of piezoelectric motors.

8. The substrate support unit according to claim 5, wherein the controller independently controls the piezoelectric actuator of each piezoelectric motor of the plurality of piezoelectric motors so that the plurality of lift pins have the same height in the lifted position.

9. The substrate support unit according to claim 5, wherein the lift pin assembly further includes:

a pin plate that supports the plurality of lift pins, and wherein the pin drive unit is installed on the pin plate.

10. A substrate processing apparatus comprising:

a chamber having a processing space;

a substrate support unit that supports a substrate in the processing space; and a gas supply unit that supplies a process gas into the processing space, wherein the substrate support unit includes:

a substrate support member on which the substrate is placed, the substrate support member being provided with one or more pin holes vertically penetrating the substrate support member, and a lift pin assembly configured to be lifted along a corresponding pin hole among the one or more pin holes, wherein the lift pin assembly includes:

a plurality of lift pins, each lift pin of the plurality of lift pins inserted into the corresponding pin hole to be lifted to a lifted position, a pin drive unit that includes a plurality of piezoelectric motors coupled to the plurality of lift pins, respectively, wherein each piezoelectric motor of the plurality of piezoelectric motors includes an electric motor configured to lift a corresponding lift pin of the plurality of lift pins to a first position and a piezoelectric actuator configured to adjust a height of the corresponding lift pin positioned at the first position by the electric motor, and a height detection sensor configured to detect a height of each lift pin of the plurality of lift pins at the lifted position, wherein each piezoelectric motor of the plurality of piezoelectric motors further includes:

a first connection shaft connecting the piezoelectric actuator and the electric motor with each other; and a second connection shaft connecting the piezoelectric actuator to the corresponding lift pin of the plurality of lift pins, and a controller configured to:

control the electric motor to lift the corresponding lift pin to the first position;

receive height information of each of the plurality of lift pins from the height detection sensor after the plurality of lift pins are lifted to the first position; and control the piezoelectric actuator by adjusting an applied voltage to the corresponding lift pin based on the received height information, thereby compensating for height differences among the plurality of lift pins lifted to the first position.

11. The substrate processing apparatus according to claim 10, wherein in each of the plurality of piezoelectric motors, the piezoelectric actuator is configured to expand or contract in a vertical direction in response to a supply of power.

12. The substrate processing apparatus according to claim 11, wherein a height of each of the plurality of lift pins is adjusted by adjusting power supplied to the piezoelectric actuator in each of the plurality of piezoelectric motors.

13. The substrate processing apparatus according to claim 10, wherein the controller independently controls the piezoelectric actuator of each piezoelectric motor of the plurality of piezoelectric motors so that the plurality of lift pins have the same height in the lifted position.

14. The substrate processing apparatus according to claim 10, further comprising:

a substrate level sensor configured to detect a height and an inclination of the substrate transported into the processing space.

* * * * *